(12) United States Patent
Schulz

(10) Patent No.: US 6,194,903 B1
(45) Date of Patent: Feb. 27, 2001

(54) CIRCUIT FOR ACQUISITION OF THE CAPACITANCE OR CAPACITANCE CHANGE OF A CAPACITIVE CIRCUIT ELEMENT OR COMPONENT

(75) Inventor: Jörg Schulz, Meckenbeuren (DE)

(73) Assignee: i f m electronic GmbH, Essen (DE)

( * ) Notice: Subject to any disclaimer, the term of this patent is extended or adjusted under 35 U.S.C. 154(b) by 0 days.

(21) Appl. No.: 08/982,483

(22) Filed: Dec. 2, 1997

Related U.S. Application Data

(63) Continuation-in-part of application No. 08/786,134, filed on Jan. 21, 1997, now abandoned.

(30) Foreign Application Priority Data

| Jan. 21, 1996 | (DE) | 196 01 903 |
| Jan. 21, 1997 | (DE) | 197 01 899 |
| Oct. 7, 1997 | (DE) | 197 44 152 |

(51) Int. Cl.$^7$ ............................................. G01R 27/26
(52) U.S. Cl. ................................. 324/661; 324/678
(58) Field of Search .................................. 324/672, 674, 324/676, 677, 679, 681, 684, 686, 660, 661; 340/870.37

(56) References Cited

U.S. PATENT DOCUMENTS

| 4,459,541 | 7/1984 | Fielden et al. | 324/679 |
| 4,743,837 | * 5/1988 | Herzog | 324/678 |
| 5,042,299 | * 8/1991 | Wells | 324/678 |
| 5,175,505 | * 12/1992 | Magenau et al. | 324/678 |
| 5,412,327 | 5/1995 | Meinen | 324/686 |

FOREIGN PATENT DOCUMENTS

| 31 43 114 | 7/1982 | (DE) |
| 34 13 849 | 8/1985 | (DE) |
| 35 44 187 | 6/1987 | (DE) |
| 40 39 006 | 3/1992 | (DE) |

* cited by examiner

Primary Examiner—Safet Metjahic
Assistant Examiner—Vincent Q. Nguyen
(74) Attorney, Agent, or Firm—Nixon Peabody LLP; David S. Safran

(57) ABSTRACT

A circuit for acquisition of the capacitance or capacitance change of a capacitive circuit component with a clock generator (1), changeover contact (2) controlled by the clock generator (1), a storage capacitor (3), a voltage source (4), and an evaluation stage (5). An electrode of the capacitive circuit component is connected to the input (7) of the changeover contact (2), a first output (8) of the changeover contact (2) is connected to a first electrode of the storage capacitor (3), a first electrode of the storage capacitor (3) is connected, on the one hand, via a resistance network (9) to the voltage source (4), and on the other hand, to the evaluation stage (5). The second electrode of the storage capacitor (3) is connected to a reference potential (10). In a first aspect of the invention, the circuit can compensate for disruptive influences especially well by the evaluation stage (5) being suitable for current evaluation with essentially no voltage excursions occurring on the changeover contact (2). According to a second aspect of the invention, the evaluation stage (105) is suitable for voltage evaluation and the resistor network (108) is adjustable.

10 Claims, 3 Drawing Sheets

CIRCUIT FOR ACQUISITION OF THE CAPACITANCE OR CAPACITANCE CHANGE OF A CAPACITIVE CIRCUIT ELEMENT OR COMPONENT

CROSS-REFERENCE TO RELATED APPLICATION

This application is a continuation-in-part of U.S. patent application Ser. No. 08/786,134 filed Jan. 21, 1997, now abandoned.

BACKGROUND OF THE INVENTION

1. Field of the Invention

The invention relates to a circuit for acquisition of the capacitance or capacitance change of a capacitive circuit element or component, with a clock generator, a changeover contact controlled by the clock generator, a storage capacitor, a voltage source, and an evaluation stage in which one electrode of the capacitive circuit element or component is joined to the input of the changeover contact, the first output of the changeover contact is joined to the first electrode of the storage capacitor, the first electrode of the storage capacitor on the one hand is connected via a resistor network to the voltage source and on the other hand to the evaluation stage, and the second electrode of the storage capacitor is connected to a reference potential.

Within the framework of the invention, the "capacitance" is the capacitance value of a circuit element or component; a "capacitance change" is, consequently, the change of the capacitance value of a capacitive circuit element or component; the "acquisition" of capacitance or a capacitance change is both only a qualitative acquisition and also quantitative acquisition, therefore a genuine measurement; a "capacitive circuit element or component" is each circuit element and each component which has capacitive properties, and is often also called a capacitance, then the capacitance value not being intended; and a capacitive "circuit element or component" is especially a capacitor. However, within the framework of the invention, a "capacitive circuit element or component" is also the electrode of a proximity switch in cooperation with an influencing body, and for example, within the framework of the invention, a "capacitive circuit element or component" is also the capacitance which is represented by lines acting capacitively with one another. In the following, instead of "capacitive circuit element or component," a sensor capacitor is always addressed without being associated with a limitation to a capacitor in a narrower sense.

Within the framework of the invention a "voltage source" is both a voltage source overall and also a terminal of this voltage source.

Finally, it is also noted that, by way of explanation, within the framework of the invention, "changeover contact" means a switch which is often also called a two-way contact and which, therefore, also has one input and two outputs, the input being joined either to the first output or to the second output.

The subject matter of the invention is not only a circuit for acquisition of the capacitance or capacitance change of a capacitive circuit element or component, but the subject matter of the invention is also a process for acquisition of the capacitance or capacitance change of a capacitive circuit element or component.

2. Description of Related Art

A circuit of the type described initially is known from published German Patent Application No. 40 39 006, but the circuit described therein is neither intended nor suited for use in a capacitive proximity switch. Rather, this circuit is used as a capacitance-frequency converter for generating an essentially rectangular converter output signal with a frequency that is dependent on the capacitance of a capacitor to be measured. For this reason, the circuit known from German Patent Application No. 40 39 006 delivers a frequency as the output signal as well.

In circuits of the initially described type, especially in the area of the sensor capacitor, a plurality of parasitic capacitances occur which can adulterate the measurement result. Basically, these parasitic capacitances can only affect the measurement result when a voltage excursion occurs and the amount of charge which has changed or been recorded in doing so has effects on the measurement result. If this voltage excursion is prevented, the parasitic capacitances inherent in the circuit can no longer have an effect.

SUMMARY OF THE INVENTION

In view of the foregoing, a primary object of the present invention is to devise a circuit of the initially mentioned type which is especially well suited for use in a capacitive proximity switch, but which can also be used advantageously for other purposes.

In addition, it is a further object to provide a circuit in which disturbance influences, such as component tolerance or temperature drift, can be balanced during the measurement.

Yet another object of the invention is to provide a circuit of the mentioned type with which parasitic capacitances that adversely affect the measurement result can be, for the most part or entirely, prevented.

The circuit according to a first teaching of the invention has an evaluation stage which is suitable for current evaluation, and with which, more or less, no voltage excursion occurs on the changeover contact. Within the framework of the invention current evaluation means, this means that essentially no voltage difference occurs at the outputs of the changeover contact. The changeover contact switches between the same voltages, so that no voltage excursion takes place at the input of the changeover contact.

If, as indicated above, no voltage excursion occurs at the input of the changeover contact, this means that the sensor capacitor is not sensitive and thus, for example, a proximity switch would not detect an object in the vicinity. For this reason, in the circuit of the invention, an auxiliary voltage is applied to the capacitive circuit element or component which is synchronized with the changeover frequency of the clock generator. Because a voltage excursion occurs due to the applied auxiliary voltage at the input of the changeover contact, and thus, also on the sensor capacitor, the capacitance or a capacitance change of the sensor capacitor can be measured.

According to one preferred, especially advantageous embodiment of the invention, the auxiliary voltage is temporarily turned off and a compensation measured value is generated from the measured value which then remains. If the auxiliary voltage is turned off, the sensor capacitor is electrically separated from the environment and only actions which arise within the circuit take effect. The measured value which then remains contains all offset errors of the entire circuit, for example, component tolerances, production tolerances, or temperature effects. The remaining measured value which results from all these interfering influences can now be stored as a new "zero value" and can be taken as a reference for further measurement. For this compensation cycle, besides turning off the auxiliary voltage, different techniques are possible which are all based on modulation of the auxiliary voltage in order to determine the actual capacitance value or the actual capacitance change of the sensor capacitor from the value which has been currently measured, all inevitable offset influences then being removed. For example, phase or amplitude modulation of the auxiliary voltage is possible, just like a phase reversal of the auxiliary voltage by 180° synchronously to the switching instant of the changeover contact.

The circuit according to the invention undergoes an additional improvement by the fact that there is a reference branch connected to the output stage for measuring a reference capacitance with a second changeover contact, a second storage capacitor and a second resistor network. Here, the reference capacitor, the second changeover contact, the second storage capacitor and the second resistance network are connected to one another in the same way as the sensor capacitor, the first changeover contact, the first storage capacitor, and the first resistor network are connected to one another. If the circuit according to the invention is made without such a reference branch, it can be built very easily, and due to the small number of parts, also very economically; but, it requires a relatively large useful signal, since difference formation is not possible. However, this circuit, especially in conjunction with the possible use of a compensation cycle, can be an economical alternative for a proximity switch which is used, for example, as a hand probe.

By the placement of a parallel reference branch which is joined to the same clock generator, two measurement channels which are completely separate from one another, and which do not mutually influence one another, are available. The outputs of the two measurement channels can then be delivered to the evaluation stage for purposes of a obtaining a difference signal.

As when a single measurement channel is being used, also when an additional reference channel is used, the two switching cycles of each channel can be actively used so that, in spite of low-frequency disturbances, as pure as possible a common-mode signal is formed and can be separated by common mode rejection from the useful signal with a suitable amplifier technique. Moreover, when the two switching cycles are of the same length, i.e. the clock generator delivers a duty factor of roughly 50%, it is advantageous for good common mode rejection of a low frequency interference signal.

According to a preferred embodiment of the invention, the second output of the first changeover contact is connected to the first input of the second changeover contact and the first output of the first changeover contact is connected to the second output of the second changeover contact. This interconnection of the measurement channel and the reference channel yields two active outputs which can be used for good, low frequency noise suppression, at the same time there being two measurement inputs, as is especially advantageous for proximity switches. The useful current in one switching cycle is directly extracted from the useful current in the second switching cycle without the need for prior amplification which could cause distortion of the measurement signal under certain circumstances.

Coupling of the auxiliary voltage to the capacitive circuit element or component is possible in different ways. Thus, for example, the auxiliary voltage can be coupled to the one electrode of the sensor capacitor via an external probe construction. Alternatively, coupling of the auxiliary voltage can, however, also take place via an internal coupling capacitor to one electrode of the sensor capacitor. The series connection then present, which consists of the coupling capacitor and sensor capacitor, represents a capacitive voltage divider, so that the voltage excursion on one electrode of the sensor capacitor depends on its capacitance value. A change of the voltage excursion then causes current to flow through a resistor which is series connected to the electrode of the sensor capacitor and thus engenders the required current variation in the measurement channel.

According to another version of the first teaching of the invention, the evaluation stage has a difference current amplifier to which a microprocessor is series connected. If the circuit according to the invention contains one such evaluation stage, then the compensation cycle described above can be used especially effectively. It is then possible, for example, to initiate one such compensation cycle at certain time intervals or triggered by certain events, and to store the new "zero value" then obtained and use it as a reference to the next measurements.

According to a second teaching of the invention, the objects of the invention are achieved by the evaluation stage of the circuit described above being suitable for voltage evaluation and the resistor network being adjustable.

One first important advantage of the circuit according to the second teaching of the invention, with respect to interference immunity, is its low input impedance. This low input impedance represents an especially important property in particular at interference frequencies in the middle frequency range (roughly 10 kHz–10 MHz). This applies especially to the measurement of very small capacitances, for example, far below 1 pF. At such small capacitances, the interference current which must drain again to ground via the electrode of the unknown capacitance is determined only by the small coupling capacitance to the interference source. A so-to-speak constant interference current is forced. Thus, it is clear that series resistors for voltage division hardly have any effect if the impedance of the actual input circuitry is too high. Therefore, at lower frequencies, roughly around 10 kHz, the interference current is generally harmlessly small, so that highpass behavior occurs via the small coupling capacitance and low input impedance. At medium frequencies, roughly 1 MHz, parasitic capacitances between the electrode or the unknown capacitance and ground lead to capacitive voltage division which, however, is by no means enough, and at the same time, these parasitic capacitances cannot be optionally increased to any degree without also dividing down the necessary change of the measurement capacitance. Therefore, in the medium frequency range, only a low input impedance is feasible, so that the already induced interference current causes as small as possible a voltage drop on the input circuitry. Low input impedances for the medium frequency range are accomplished in the prior art either via capacitances or resistances which normally make simultaneous measurement of very small capacitances in the fF range impossible. This can be done by a circuit with a working frequency above roughly 100 MHz, which would generally be of low enough resistance, but which can hardly be managed at the same time, and moreover, would be costly to build, would be current-intensive and emission-intensive.

Another advantage of the circuit according to the second teaching of the invention is that the input circuitry has no nonlinear components. In conventional input circuitry of circuits for measuring small capacitances which are used, for example, in capacitive proximity switches, there is generally an amplifier which amplifies the time behavior of the unknown capacitance and which converts it into a more easily usable electrical quantity, for example, an oscillator amplitude, a frequency, or a phase angle. This amplifier, however, is also relatively directly exposed to the inevitable interference voltages of different frequencies. Since these amplifiers, at least in partial ranges of the modulation amplitude or in certain frequency ranges, have nonlinear current-voltage characteristics or nonlinear input-output characteristics, interference quantities superimposed by the useful signal can very easily cause effects which can, to some extent, significantly adulterate the actual measured value, for example, by asymmetrical modulation capacity, demodulation effects, and working point drift. Furthermore, there is the danger that the interference signal, under certain circumstances, could be amplified just like the measurement signal without electronic differentiation between the interference signal and the measurement signal. In this circuit, in the input circuitry, only elements with linear current-voltage characteristic and linear input-output characteristic are used, specifically resistances and capacitances. The electronic changeover switch is active in structural terms and is a nonlinear component but, for the purposes of changeover, has sufficiently good linearity and no gain, so that the electronic switches which comprise the changeover switches and which, of course, do not have ideal properties, can themselves be considered "linear" components for this circuit.

Finally, an additional advantage of the circuit according to the second teaching of the invention is its flexibility. The clock frequency of the clock generator, the operating voltage, the sampling rate and the unknown capacitance of the circuit can be matched relatively easily to the configuration which is most favorable for a given application. This is based on the fact that the individual operating parameters are relatively little dependent on one another. In conventional oscillator circuits known from the prior art for measuring a capacitance, there is often only a very narrow range of oscillator frequency, coupling factor, operating voltage, etc. in which an acceptable compromise is reached between all properties of the circuit, often even minor changes requiring complete re-optimization. Therefore, in this circuit, necessary, application-dictated optimization efforts are also much less complex and thus less time consuming than in the principles known from the prior art.

Because the resistance network can be tuned, simple working point adjustment of the circuit is ensured. The optimum working point of the circuit according to the first teaching of the invention is reached when the voltage on the first electrode of the storage capacitance corresponds to half of the output voltage of the voltage source at the input of the resistor network. In this case, the maximum DC voltage excursion arises on the first electrode of the storage capacitance depending on the change of capacitance.

Adjustment of the working point of the circuit according to the second teaching of the invention via the resistor network is advantageous, therefore, first of all, because it can be done very easily, for example, via a potentiometer. The actuator necessary for the tunability of the resistor network is, moreover, loaded only with a low direct current and the requirements for this actuator are therefore low. It can, for example, also be galvanically connected to the ground or the power supply voltage. This entails major advantages for purposes of interference engineering, since long lines to the actuator, which are necessary for purposes of layout or application, can cause hardly any interference coupling. If necessary, the line can also be blocked in the vicinity of the sensor in a highly capacitive manner.

Therefore, the actuator need not be potential-free and can, fundamentally, also be formed of a more complex circuit, for example, a transistor matrix or the like. Furthermore, the fact that only a small direct current flows through the actuator minimizes the requirements for frequency behavior of the actuator, since parasitic capacitances and the like play no role at all. Thus, the route for digitized methods of working point adjustment is promisingly clear. In conventional circuits known from the prior art for measuring a capacitance, the actuator is often a component of an oscillator circuit, and thus, generally very sensitive to parasitic capacitances and interference coupling.

In a first advantageous embodiment circuit according to the second teaching of the invention is achieved by the clock frequency of the clock generator being between 1 MHz and 4 MHz. A clock generator with this frequency can, for example, be made as a ceramic resonator. When the demands on the measurement accuracy of the circuit of the invention are higher, recourse to clock generators with higher frequency stability are necessary. In this case, it is necessary to weigh between frequency stability and the costs of the clock generator.

The choice of the frequency band between 1 MHz and 4 MHz for the clock generator is tailored especially to the measurement of very small capacitances. At very low frequencies for the clock generator, the energy transferred in the charging or discharging process is almost too small to enable reasonable evaluation. For this frequency, then, the impedance of the input circuitry would have to be relatively high, usually greater than 100 kΩ, in order to be able to evaluate a capacitive impedance resulting from the unknown capacitance as a parallel impedance of the same magnitude. In this design of the input circuit, high voltage drops occur accordingly, in part in the range of a few volts, due to the interference current. Generally, these voltage drops can hardly be handled without adulteration of the measurement signal. As already mentioned, the circuit at a clock frequency above 100 MHz would have low enough resistance, but would be difficult to control.

Another advantage of a clock frequency in the range between 1 MHz and 4 MHz is the very good averaging for the measured value of the unknown capacitance. At this clock frequency, in the input part of the circuit according to the second teaching of the invention, the unknown capacitance is converted directly and without amplification via the process of charge displacement into an easily usable and easily filtered DC voltage, at the same time averaging taking place over many thousand clock cycles. The prerequisite for correct averaging is, in turn, the use of components which have a linear behavior. An adjacent interference signal must, therefore, take the same path through the input circuitry, and thus, consequently also undergoes averaging. Since the average value of an interference signal is zero, assuming that no nonlinear influences occur on the entire interference path from the source to the DC voltage, superposing of the measurement signal on the interference signal yields only the measurement signal, i.e. the average of the disturbed measurement signal must be equal to the average value of the undisturbed measurement signal for complete interference suppression.

Additionally, at clock frequencies above 4 MHz, the poorly definable changeover times of the changeover contact and the rise rates are important as disturbance factors. In applications with larger capacitances to be measured, however, clock frequencies below 1 MHz are also possible, depending on the expected size of the unknown capacitance.

With respect to the sensitivity to high frequency incoming interference emissions, efforts are generally directed at a clock frequency above 1 MHz since, for example, the harmonics of frequency converter disturbances below 1 MHz can have relatively large amplitudes.

If, according to another embodiment of the circuit according to the second teaching of the invention, there is a frequency modulator which modulates the clock frequency of the clock generator, the suppression of constant frequency noise quantities at the clock frequency or in the vicinity of the clock frequency is possible.

If an interference frequency should be directly adjacent or exactly on the clock frequency, and the clock frequency is also constant, a low frequency beat occurs, and thus, also a low frequency AC voltage component on the measurement signal which is erroneously interpreted as a measurement signal. By modulating the clock frequency of the clock generator by means of a frequency modulator, it is almost precluded that the low frequency beat mentioned above can occur by superposition with an interference frequency. In this proposed frequency modulation, the frequency deviation should be as large as possible. It is also feasible, if it can be achieved, that the frequency variation runs roughly triangularly with slightly variable edge steepness due to modulation. The formation of a wide frequency spectrum in the area of the clock frequency which is comprised of very many immediately adjacent spectral lines of the same size is decisive, the clock frequency itself no longer projecting from under the other spectral lines. A discrete interference frequency can only form a low frequency beat with very few spectral lines, all the information being distributed over a wide frequency band. Likewise, it is possible to use a band-limited noise generator as the modulation source or even as the clock generator.

With respect to interference immunity, the circuit according to the second teaching of the invention undergoes an especially advantageous embodiment by there being one electrode coupling network which encompasses at least one coupling resistance between the electrode of the unknown capacitance and the input of the changeover contact.

A coupling resistance is especially essential for high interference frequencies since, in this case, the interference source is coupled by low resistance to the electrode of the unknown capacitance. The coupling resistor with the low-resistance channel resistor of the changeover contact then forms a potentiometer-type resistance. The storage capacitor acts almost as a short circuit for interference frequencies above 1 MHz. At even higher interference frequencies, the coupling resistor with the parasitic input capacitance of the changeover contact then forms a lowpass filter.

Add to this the advantageous fact that, at the instant of changeover from the discharging state to the charging state, the voltage at the input of the changeover contact also rises very rapidly with optimum working point adjustment to roughly half the power supply voltage of the voltage source, while the unknown capacitance is charged only slowly via the coupling resistor in the electrode coupling network. For an interference voltage, this means that, in the charging state, it is almost impossible to cause a voltage on the changeover contact which lies outside the limits of the operating voltage; when these limits are exceeded, protective diodes would become active, and thus, an additional charge would be transported.

The coupling resistor is designed to protect the input circuitry against overly large voltage drops in spite of the relatively low-resistance dimensioning. This is effective primarily in the interference frequency range above 5 MHz. Therefore, the coupling resistors should be dimensioned to have resistances as high as possible. But, in this regard, it must be watched that the unknown capacitance can still be recharged as completely as possible in all conceivable situations.

An overall low input impedance for interference immunity, that is guaranteed over all frequency ranges, is ensured in a further configured circuit according to the second teaching of the invention by a protective resistor being located between the second output of the changeover contact and the first electrode of the storage capacitance.

Admittedly, for interference frequencies somewhat above 5 MHz, the coupling capacitance is a still lower impedance, and thus, coupling of interfering radiation is even harder; but here, protective circuitry which hardly acts at all for the working frequency of the circuit can, together with parasitic capacitances, form a lowpass filter with sufficient attenuation. The input circuitry of this circuit has an unusually low impedance in both the charging and discharging state, this impedance, for the relevant frequency range, is preferably below 1 k$\Omega$. This ensures that the existing interference currents in the input circuitry, especially on the changeover contact, allow only harmlessly small voltage drops. In the discharging state, the electrode of the unknown capacitance is switched only via the coupling resistor to a reference potential, while in the charging state the same electrode of the unknown capacitance is switched via a preferably low-resistance protective resistor to the large storage capacitance which represents a low impedance for the chosen frequency range as well. Thus, overall, this circuit according to the second teaching of the invention, ensures effective voltage division to safe values for all relevant interfering factors.

Optimum narrowbandedness of the circuit according to the second teaching of the invention is ensured by a filter network being located between the second output of the changeover contact and the output stage according to another version.

Since, as mentioned above, the principle of measurement signal acquisition is based on averaging, for complete interference suppression, the requirement arises that this average value should not change under the influence of interference so slowly that the resulting DC voltage fluctuation can pass through a filter network and thus can be acquired by the output stage. In other words, this means that the beat between the clock frequency and the interference frequency always remains at a high enough frequency to prevent passage through the filter network. But, in positive terms, this means that good narrowbandedness can only be achieved by lowpass dimensioning of the filter network to large time constants of a few milliseconds. That is, an interfering frequency remains without effect if it lies very close to the clock frequency without expensive narrowband engineering of the input signal. This minimizes the probability of interference having an effect, especially in concert with the use of a frequency modulator. The modulation frequency of the frequency modulator should, in any case, be so high that it cannot pass through the filter network. In order to prevent an undue adverse effect on the measurement accuracy, the modulation frequency should be so high that it can no longer pass through the filter network, but is not unnecessarily higher either.

If the circuit of the invention is used in capacitive proximity sensors, the required object acquisition frequency, therefore the maximum frequency with which the moved objects are to be acquired, determines the design of the filter network.

The circuit according to the second teaching of the invention is additionally improved by there being a reference branch connected to the output stage for measuring the reference capacitance with a second changeover contact, a second storage capacitance, a second resistor network, and a second filter network, similar to a configuration according to the first teaching of the invention.

The arrangement of a parallel reference branch which is connected to the same clock generator, the same frequency modulator and the same voltage source, conventionally, ensures that the time-dependent or temperature-dependent drifts of these components are eliminated by difference formation in the output stage.

An especially advantageous embodiment of circuit of the invention is achieved when a measurement electrode of a capacitive proximity switch, in concert with the environment to be observed, forms the unknown capacitance, and when a screening electrode of the measurement electrode of the capacitive proximity switch, in connection with its environment, forms the reference capacitance. The circuit arrangements according to the first and second teaching of the invention are in many respects almost predestined for use in a proximity switch.

Since capacitive proximity switches are subject to strong price pressure, the basic circuits long known for these purposes are relatively simple. Essentially, they consist of a RC oscillator which has an oscillation amplitude or oscillation onset which is dependent on the capacitance between the measurement electrode and the environment to be observed, and which is converted via a demodulator circuit into a switching or analog signal. In fill level engineering, acceleration measurement engineering, pressure measurement engineering, etc. there are also many other processes, for example, admittance measurement, disturbance of a monostable multivibrator by a sensor capacitance as a time-determining element, methods in which the change of the resonant frequency of an oscillating circuit is measured, methods of phase measurement with small capacitances, various AC bridge circuits or circuits which use charge-discharge functions of RC elements. There are also processes based on charge transport.

Most of the known circuits are not used in capacitive proximity switches, but in other applications which are less critical in terms of interference engineering. For example, in fill level engineering, there is generally the advantage that the capacitance change which can be evaluated is higher by orders of magnitude than in proximity switches and that, in addition, the amount of space available is usually much more favorable. Furthermore, there is often the possibility here, as in pressure measurement engineering, of shielding the sensor electrodes partially or entirely against electromagnetic disturbance factors.

In capacitive proximity switches, the "antennas to the outside world," which of course also receive the interfering quantities, are essential for operation. At the same time, the interference coupling into the sensor circuit can occur in different ways, for example, line-routed or radiated, and in addition, it is very strongly dependent on the installation situation, the object distance, the direction from which the interference signal is coupled, and other boundary conditions. Moreover, the requirements with respect to power consumption are higher, especially for two-wire operation. In addition, it must be possible to easily and automatically remove moisture and dirt on the surface of the capacitive proximity switch. All these requirements yield a demanding profile of requirements for a capacitive proximity switch which is to be produced economically and in large numbers, and which is intended to deliver precise, reproducible results regardless of the immediate proximity of strong electromagnetic noise sources in a severe industrial environment.

In contrast to the circuit according to the teaching of the invention, the known basic circuits do not meet the described requirements especially with respect to interference immunity.

With respect to use of the circuit in a capacitive proximity switch according to the second teaching of the invention, it is made especially advantageous by making the output stage as a comparator. When the output stage is made as a comparator, it is advantageous that frequency modulation of the clock frequency of the clock generator, i.e. the frequency modulation which is desired with regard to noise suppression, can influence the amount of measured voltage or current difference, but not its polarity. Since, when using an output stage made as a comparator, only the polarity, but not the amount of measured difference, is assessed, the frequency stability here appears as a quantity relevant to accuracy only to a minor degree. In this execution of the output stage, therefore, a band-limited noise generator is suggested as a clock generator.

Connecting the electrode coupling network of the shielding electrode to the clock generator via a tuning network enables tuning of the specific behavior of a capacitive proximity switch, for example, with respect to moisture compensation and side sensitivity.

Because the tuning network has a time delay element, it is ensured that the behavior of the capacitive proximity switch is optimized, especially with respect to behavior during the changeover phases of the changeover contacts.

The circuit undergoes a last advantageous embodiment according to the second teaching of the invention by the second resistance network undergoing positive feedback via the output signal of the output stage. Hysteresis of the output signal of the output stage is generated via this measure for operation of the circuit according to the first teaching of the invention in a capacitive proximity switch in an especially simple manner.

According to the third teaching of the invention, the indicated object is achieved by a process for measurement of capacitance, especially using the above described circuit, by periodically charging and discharging the unknown capacitance in alternation using a changeover contact controlled by a clock generator, by the unknown capacitance being charged to the capacitance of a storage capacitance, by the unknown capacitance being discharged to a reference potential, by the storage capacitance being recharged using a voltage source via a resistance network, and by the unknown capacitance being determined from the potential of the storage capacitance using an output stage. This process according to the second teaching of the invention achieves the advantages described with respect to the first teaching of the invention regarding interference immunity, i.e., low input impedance, no nonlinear components in the input circuitry, averaging, narrowbandedness and noise suppression at the clock frequency and the other advantages, such as a flexible operating principle and simple working point adjustment.

Other shared advantages of the second and third teaching of the invention are that amplification takes place only after repeated filtering and that layout engineering can be done especially advantageously.

Because repeated filtering of the measurement signal takes place before the circuitry of the necessary, but also interference-sensitive amplifier part in the circuit of the invention and in the process of the invention, it is advantageously ensured that, at this time, the interference signal is already almost completely separated from the measurement signal by several filter stages, and thus, is not amplified at the same time. For this reason, the measurement signal remains for the output stage, whether with or without an interference quantity in the input circuitry. In addition, there remains a relatively large margin in the layout engineering of the circuit so that additionally required shielding measures can be easily and effectively implemented.

Because the capacitively sensitive part of the circuit is limited to a relatively narrow switching range with few printed conductors in the electrode coupling network and in the input circuitry and in the following components of the circuit, only the DC voltage or low frequency signals up to a few 100 Hz need be processed, layout engineering additionally enjoys a large margin and shielding measures which may be necessary can be carried out easily, as already mentioned. The parasitic capacitances caused by the layout play no role in most of the circuit for the same reasons. Furthermore, the sensitive amplifier part of the output stage need not necessarily be located in the immediate vicinity of the unknown capacitance, so that it can be easily blocked against high frequency interfering radiation.

In particular, there is now a plurality of possibilities for configuring and developing the circuit according to the first and second teaching of the invention and the process according to the third teaching of the invention for measuring capacitance.

These and further objects, features and advantages of the present invention will become apparent from the following description when taken in connection with the accompanying drawings which, for purposes of illustration only, show several embodiments in accordance with the present invention.

DETAILED DESCRIPTION OF THE PREFERRED EMBODIMENTS

Figure 1:
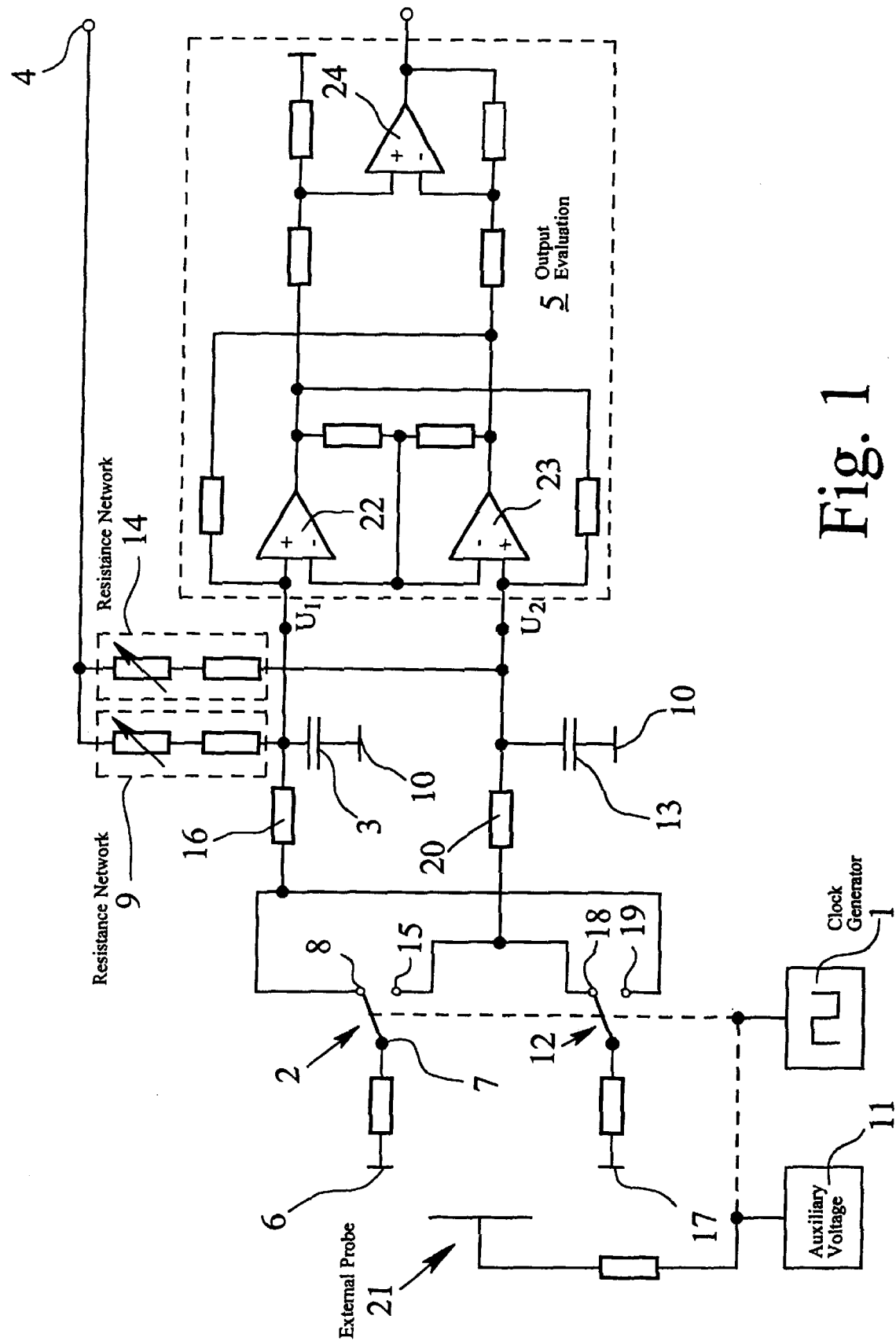
FIG. 1 shows a preferred embodiment of a circuit for measuring capacitance according to a first teaching of the invention.

The circuit shown in FIG. 1 comprises a clock generator 1, a changeover contact 2 which is controlled by the clock generator 1, a storage capacitor 3, a voltage source 4, and an output evaluation stage 5. An electrode 6 of an unknown capacitance is connected to an input 7 of the changeover contact 2. The second electrode of the sensor capacitor represents an external object that is not shown here. The unknown capacitance is, then, between the electrode 6 and the ground formed by the external object. First output 8 of changeover contact 2 is connected to the first electrode of storage capacitor 3. On the one hand, this electrode is connected via a resistance network 9 to voltage source 4, and on the other hand, to evaluation stage 5. The second electrode of storage capacitor 3 is at a reference potential 10. In the embodiment of the circuit shown here, the reference potential 10 corresponds to ground.

Furthermore, the circuit shown in FIG. 1 has an auxiliary voltage 11 which is synchronized with the changeover frequency of the clock generator 1. A frequency or amplitude modulator (not shown) can also be series connected to auxiliary voltage 11. In this case, auxiliary voltage 11 is capacitively coupled via an external probe structure 21 to the electrode 6 of the capacitive circuit element or component.

Furthermore, the circuit shown in FIG. 1 has a second changeover contact 12, a second storage capacitor 13 and a second resistor network 14. Thus, the circuit has a measurement branch and a reference branch. The measurement branch includes the first changeover contact 2 with input 7, the first output 8 and the second output 15, the sensor capacitor with electrode 6, storage capacitor 3, and resistor network 9, as well as additional resistor 16.

The reference branch includes, first of all, a reference capacitor with an electrode 17, a second changeover contact 12 with a first output 18 and a second output 19, a second storage capacitor 13, a second resistor network 14, and another resistor 20. The second electrode of the reference capacitor represents an external object (not shown), as in the sensor capacitor. The reference capacitor overall, however, can also be formed by a fixed capacitor.

The optimum working point can be adjusted via the two resistor networks 9 and 14, each of which contain an adjustable resistor. Both resistor networks 9 and 14 should, advantageously, be roughly the same size.

In the embodiment of the circuit shown in FIG. 1, according to the first teaching of the invention, the second output 15 of the first changeover contact 2 is connected to the first output 18 of the second changeover contact 12, and the first output 8 of the first changeover contact 2 is connected to the second output 19 of the second changeover contact 12.

As the evaluation stage 5, basically, any amplifier circuit can be used which has a low input impedance and which works in the sense of current evaluation. This amplifier circuit can, for example, be a current-voltage converter.

The evaluation stage 5 shown in FIG. 1 is comprised of a difference current amplifier circuit with two operational amplifiers 22 and 23 and a series-connected third operational amplifier 24 which works as a subtractor. The internal wiring of evaluation stage 5 provides for a voltage $U_1$ at the noninverting input of operational amplifier 22 which corresponds to the voltage $U_2$ at the noninverting input of operational amplifier 23. A microprocessor (not shown) can be series connected to the operational amplifier 24. This microprocessor can be used to control the compensation cycle, i.e. to turn off the auxiliary voltage or modulate the auxiliary voltage. This microprocessor then makes it possible to initiate the compensation cycle at certain time intervals or triggered by certain events.

RC lowpass filters (not shown) can be connected to both the measurement branch and also to the reference branch in front of the changeover contacts 2 and 12 to suppress high frequency interference fractions. Here, it is beneficial that no voltage excursions occur on changeover contacts 2 and 12, so that smaller capacitances in the measurement and reference branches can be switched without significantly affecting the measured values.

Figure 2:
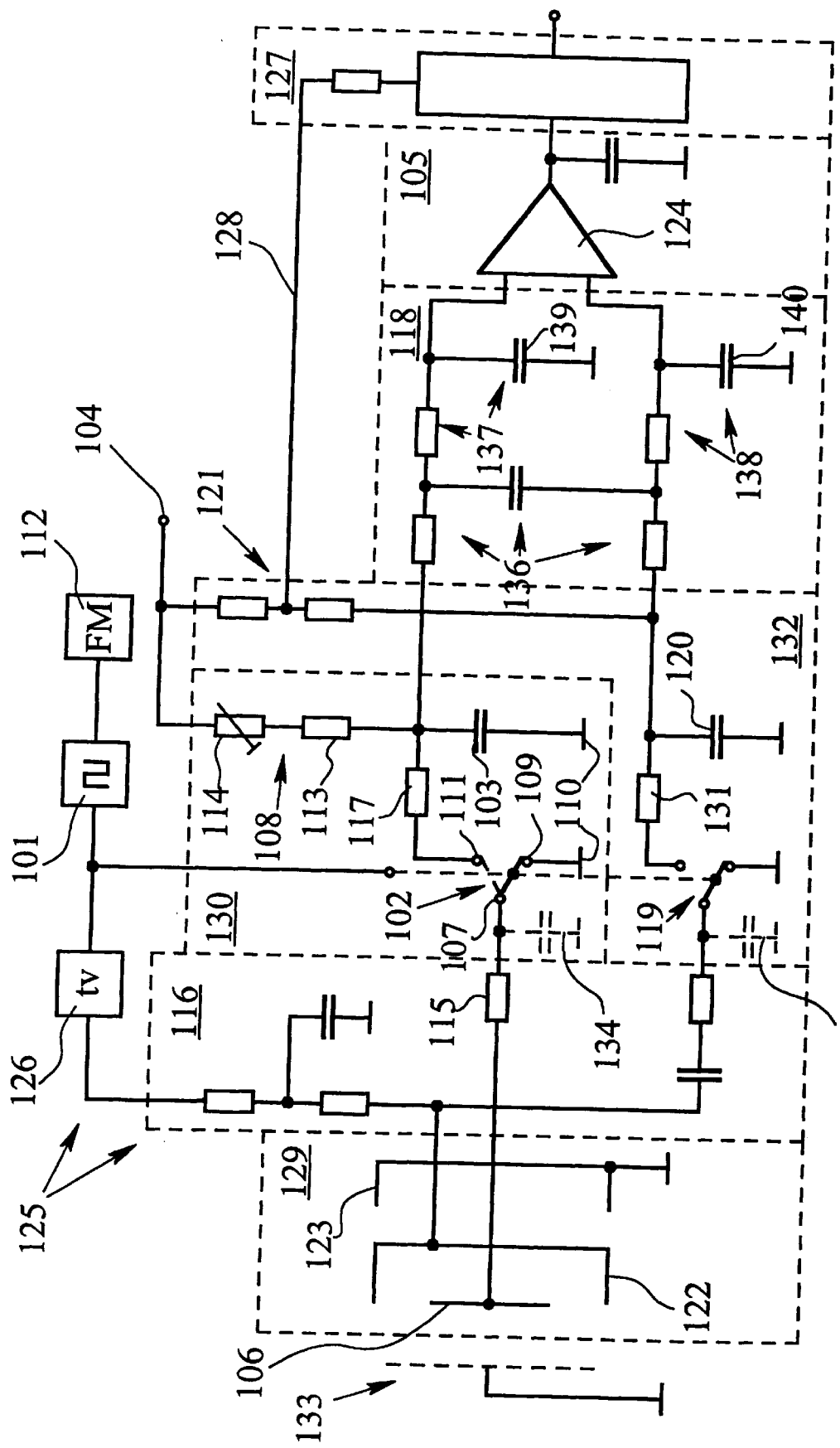
FIG. 2 shows a first embodiment of a circuit for measuring capacitance according to a second teaching of the invention.

The basic structure of the circuit in FIG. 2 corresponds to the circuit from FIG. 1. It likewise is comprised of a clock generator 101, a changeover contact 102 controlled by the clock generator 101, a storage capacitance 103, a voltage source 104 and an output stage 105. An electrode 106 of the unknown capacitance is connected to an input 107 of the changeover contact. Voltage source 104 is connected to storage capacitance 103 via a resistor network 108, and a first output 109 of changeover contact 102 is connected to reference potential 110, a second output 111 of changeover contact 102 is connected to the first electrode of storage capacitance 103, the output of resistor network 108 and output stage 105, and the second electrode of storage capacitance 103 is connected to the reference potential 110. In the embodiment of a circuit shown in FIG. 2, the reference potential 110 corresponds to ground.

Furthermore, the first embodiment of the circuit according to the second teaching of the invention, shown in FIG. 2, has a frequency modulator 112 which modulates the clock frequency of the clock generator 101. To adjust the working point, resistor network 108 is formed of a constant resistor 113 and a potentiometer 114. Between electrode 106 of the unknown capacitance and input 107 of changeover contact 102, there is an electrode coupling network 116 which encompasses at least one coupling resistor 115. Additionally, between the second output 111 of the changeover contact 102 and the first electrode of the storage capacitance, there is a protective resistor 117. Between second output 111 of changeover contact 102 and output stage 105, there is a filter network 118 following the protective resistor 117. The described components of the first embodiment of the circuit according to the second teaching of the invention, shown in FIG. 2, are hereinafter called the measurement branch, with the exception of clock generator 101 and frequency modulator 112.

In addition to the already described measurement branch, the embodiment shown in FIG. 2, similar to the circuit shown in FIG. 1, also has a reference branch for measurement of a reference capacitance with a second changeover contact 119, second storage capacitance 120 and second resistance network 121. Another part of the already mentioned filter network 118 can be assigned to the reference branch.

Since the embodiment of the circuit shown in FIG. 2 is a component of a capacitive proximity switch, electrode 106 of the unknown capacitance is the measurement electrode of the capacitive proximity switch, while the reference capacitance is formed by screening electrode 122 of the measurement electrode in conjunction with its environment. According to a conventional version, in the circuit shown in FIG. 2, besides the measurement electrode and screening electrode 122, a second grounded screening electrode 123 is shown.

In the first embodiment of the circuit shown in FIG. 2, the output stage 105 is made as a comparator having an operational amplifier 124 connected accordingly.

The electrode coupling network 116 shown in FIG. 2 is connected in its part joined to screening electrode 122 via a tuning network 125 to the clock generator 101. This tuning network 125, among others, has a time delay element 126.

Finally, the second resistor network 121 experiences positive feedback to produce hysteresis via a positive feedback signal derived by signal processing unit 127 from the output signal of the output stage 105 via a positive feedback branch 128.

To simplify further discussion of the components of the first embodiment of the FIG. 2 circuit, these components are summarized as follows. Electrode 106 is made as the measurement electrode, screening electrode 122 and second screening electrode 123 are called co-sensor electrodes 129, changeover contact 102, storage capacitance 103, resistor network 108 and protective resistor 117, are, as mentioned, called measurement branch 130 and second changeover contact 119, second storage capacitance 120, second resistor network 121 and second protective resistor 131 are called reference branch 132.

Sensor electrodes 129 form the antennas to the mechanical and electromagnetic environment of the embodiment of the circuit shown in FIG. 2 according to the second teaching of the invention. They are needed to detect an object and convert the mechanical quantity of the object distance, fill level, and the like into the electrical quantity of capacitance. They are made from a material with good conductivity, their size and structural features largely determine the attainable acquisition distance and other operating parameters of the device. In terms of circuitry, sensor electrodes 129 represent a network of capacitances and resistances; in this circuit only the capacitances are of practical importance. The measurement capacitance to be primarily evaluated in most applications is located between electrode 106, made as the measurement electrode, and the ground formed by external object 133.

Electrode coupling network 116, in this embodiment, is comprised of several RC elements and is designed essentially to accomplish the desired sensor characteristic with respect to media sensitivity, moisture compensation, and side sensitivity, to suppress interference emissions, and likewise, to suppress incoming interference radiation.

The clock generator 101 shown in FIG. 2 controls the function of the input channels for the signals as a square-wave generator. It should have steep edges to minimize the interference influences caused by various switching thresholds and to keep the switching phases which are electrically poorly defined short. Clock generator 101 can be built especially favorably in HCMOS technology.

Furthermore, clock generator 101 triggers electrode coupling network 116 directly, or via time delay element 126, as shown here. This is necessary for the specific sensor behavior, as is described above. Ideally, the clock generator 101, in its frequency and phase behavior, should not be dependent either on the input signal or the output signal of the circuit and also, especially, not on noise signals, but only on connected frequency modulator 112. This is achieved by a structure which is narrow or optionally shielded in layout. In terms of circuit engineering, a ceramic resonator serving as a frequency-determining element offers a good variation in this respect. A ceramic oscillator can be frequency modulated to the required degree, and at the same time, has sufficient resistance to drawing effects by noise frequencies.

In addition, the ceramic resonator is magnetically not as sensitive as, for example, a LC element with a ferrite core. Since the capacitance in this embodiment is not to be quantitatively determined, the frequency stability of a ceramic oscillator is not a problem either.

Time delay element 126, together with the electrode coupling network 116, is used for optimization of the sensor behavior, especially with respect to the behavior during the changeover phases of the input signals for the measurement signals. This can be achieved, for example, by the gate operating time and can also be completely omitted under certain circumstances.

Frequency modulator 112 controls the frequency of the clock generator 101 and is used to suppress the noise frequencies which are exactly on or very near the clock frequency.

Sensor channel 130 is comprised of the changeover contact 102, which is to be built here using HCMOS technology, series-connected protective resistor 117, and resistor network 108, via which storage capacitance 103 is continually charged. Resistor network 108 includes the possibility of adjusting the working point, therefore, for adjusting the sensitivity or the operating distance, and for balancing of dispersions. For this reason, a potentiometer 114 is provided in the resistor network 108.

Sensor branch 130 is switched back and forth between two digital states by the clock generator 101. In the discharging state, the sensor branch 130 discharges the unknown capacitance and the parasitic capacitance 134 inherent in the electronic switch to ground. In the discharging state, the input 107 of the changeover contact 102 is connected to the first output 109. In the charging state, the unknown capacitance and the parasitic capacitance 134 are switched to storage capacitance 103. In this state, the input 107 of changeover contact 102 is connected to the second input 111. A charge transfer is caused by changeover. A small part of storage capacitance 103, which is large to very large (10 nf–1 μf) compared to the unknown capacitance and parasitic capacitance 134, is supplied to the unknown capacitance and parasitic capacitance 134. The amount of this charge depends on the size of the unknown capacitance and parasitic capacitance 134. If these capacitances are completely charged or discharged during one state, it is irrelevant whether the charge is transferred quickly or slowly to the unknown capacitance. The charge is transported more quickly to the parasitic capacitance than to the unknown capacitance since, in electrode coupling network 116, there is an additional coupling resistance 115. If complete recharging does not take place, the effect of the unknown capacitance is undesirably reduced. Since the relationship Q=C·U applies, the transported amount of charge is also dependent on the voltage to which the unknown capacitance and parasitic capacitance 134 are charged. Because this voltage is also equal to the voltage on storage capacitance 103, which is in turn a function of the charging current and charging time, after a transient recovery time charge, equilibrium is established. The amount of charge which charges storage capacitance 103 during the entire period via resistance network 108 is then equal to the amount of charge which is delivered to the unknown capacitance and the parasitic capacitance 134 only during the charging state. Since both amounts of charge, the inflowing charge amount $Q_1$ and the outflowing charge amount $Q_2$ are dependent on the voltage, the charge equilibrium can be measured as the voltage to storage capacitance 103.

Assuming that $Q_1=Q_2$, the voltage at storage capacitance 103 can accordingly be described by the following equation:

$$U_{Cs}=U_b/(R_{WN}f(C_m+C_p)+1)$$

with $U_b$=power supply voltage of voltage source 104

$R_{WN}$=ohmic resistance of resistor network 108 f=frequency of clock generator 101, $C_m$=unknown capacitance and $C_p$=parasitic capacitance 134.

Storage capacitance 103 is not part of this equation since the charge is simply stored in it temporarily. DC voltage $U_Q$ is already rather well smoothed and can now be supplied to an output stage.

The largest measurement signal, as a DC voltage excursion depending on a small capacitance change, arises when $U_{Q1}=U_b/2$. That is, the working point of the circuit is adjusted with the ohmic resistance of resistor network 108 at a certain clock frequency in the optimum case in the vicinity of $U_{Q1}=U_b/2$.

Reference branch 132 is structurally identical and behaves exactly like measurement branch 130. It delivers a DC voltage of the same size as measurement branch 130, so that the measurement signal, further processed using output stage 105, is now a DC voltage difference. This is generally necessary for the specific sensor behavior of the circuit, for instance the side sensitivity, moisture compensation or the like. The sensor electrodes 129, of course, are necessarily built and coupled such that the capacitance change due to the object which can be evaluated becomes apparent on reference branch 132, either not at all or only to a very small extent. Otherwise, the measurement signal would be compensated away, since reference branch 132 acts in the opposite direction to measurement branch 130.

In addition, with this reference branch 132, the statistically and thermally induced interference effects, such as clock frequency drift, duty factor drift, power supply voltage drift, nonideal properties of the electronic switches, and the like can be suppressed, assuming that they act roughly the same in polarity and amount on both branches and that the common mode rejection of output stage 105 is high enough. Any other thermally induced interference effects in resistor networks 108, 121 must be either balanced using potentiometer 114 or accepted.

Series-connected protective resistors 117, 131 are used both in measurement branch 130 and also in reference branch 132 to suppress differences with regard to charge transport of the digital control signal to the branch of the changeover contacts 102, 119 during the changeover phase. In addition, the remaining nonlinear portions of the channel resistors are linearized. Protective resistors 117, 131, together with parasitic capacitances 134, 135, moreover form a lowpass filter. This is important in high-speed transients which can, to some extent, have very high values in amplitude. Thus, the measurement signal would, in turn, be adulterated.

In addition, the temperature behavior caused by the changeover contacts 102, 119 can be greatly improved by inserting a low resistance in the form of the protective resistors 117, 131 in front of the storage capacitors 103, 120.

Filter network 118 is used for coupling of the DC voltage difference signal from measurement branch 130 and reference branch 132 to the output stage 105. In this embodiment of a circuit according to the second teaching of the invention, filter network 118 is comprised of a line-to-line lowpass filter 136 and line-to-ground lowpass filters 137, 138 which are connected in series. This is essential for good noise immunity values since, in this way, it is possible to achieve effective blocking of the sensitive input of the output stage 105 against high frequency interference coupling into the layout. Furthermore, very brief interference couplings, which in spite of all measures still pass through the input channels, can thus be filtered. Moreover, filter network 118 is suited to adjustment of the maximum sampling frequency with which an object is to be acquired.

Filter network 118 should form as high an impedance as possible relative to ground for the DC voltage, because otherwise the measurement signal is unnecessarily divided. The volume resistance should not exceed roughly 10 kΩ, since otherwise leakage currents which are caused by the amplifier and layout can greatly influence the measurement signal, especially over the temperature range. Capacitors 139, 140 are located directly at the inputs of operational amplifier 124, which forms one part of the output stage against ground, should be a fixed component of the circuit located spatially very near the inputs of operational amplifier 124 for indicated reasons of interference engineering.

Output stage 105, in the embodiment shown, is made to operate as a comparator. Operational amplifier 124 used for this purpose must have very good values with respect to input current and offset drift (input current roughly <2 nA, offset drift roughly <10 µV/K). Since the maximum object sampling frequency is now generally below 100 Hz, output stage 105 need not satisfy increased requirements with respect to speed. A low slew rate or, more accurately, a low open-circuit gain at frequencies around 50 Hz and small input difference voltages is even a good idea for suppression of low frequency noise voltages with a large amplitude, for example, with a line frequency of 50 Hz.

Based on these requirements, operational amplifier 124 in the prior art should preferably have input wiring in FET technology. Since output stage 105 need process only low frequencies, it can generally be blocked off even at its output; this offers additional advantages with respect to interference engineering if the amplifier type used allows this. In any case, the operational amplifier 124 used should have common mode rejection of over 50 dB; however, this is not a serious problem in a version operating as a comparator.

Further, signal processor 127 now processes the output signal of output stage 105 for the final output function of the device and is no longer, strictly speaking, part of the capacitance measuring circuit. In proximity switches, this switching part frequently comprises, for example, a Schmitt trigger stage with an inset function and end stage triggering, for example, is short circuit proof. The switching hysteresis generally necessary for proper sensor operation can take place proceeding from the signal processing stage 127, the digital switching signal being fed back via a positive feedback branch 128 so that positive feedback arises. When an analog amplifier is used, hysteresis can be produced from the switching signal using a Schmitt trigger as well.

Figure 3:
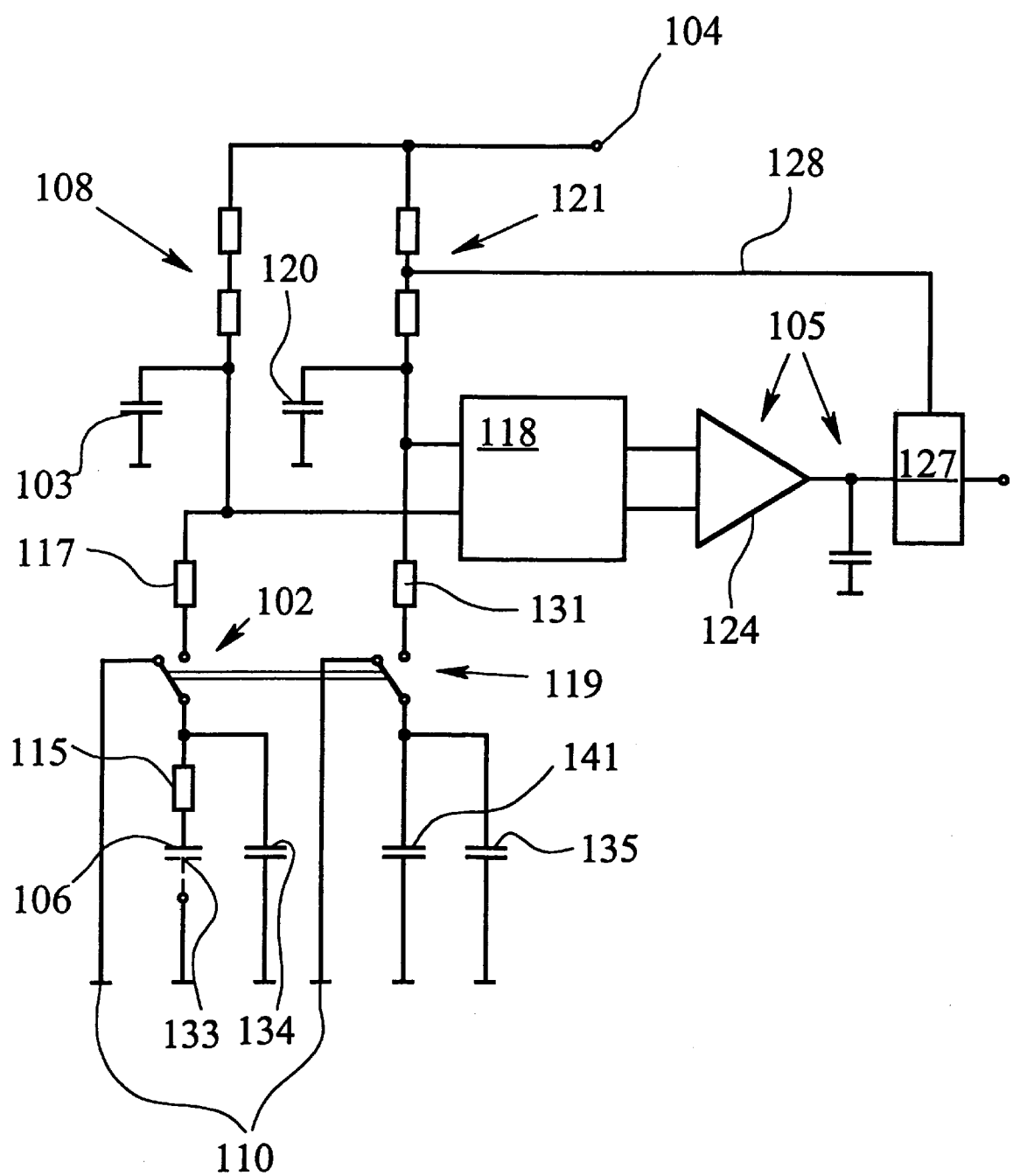
FIG. 3 shows a second embodiment of a circuit for measuring capacitance according to the second teaching of the invention.

FIG. 3 of the drawings shows a second embodiment of the circuit according to the second teaching of the invention. In FIG. 3, the components which match FIG. 2 are provided with the reference numbers used in FIG. 2.

The second embodiment of FIG. 3 differs from the first embodiment of the circuit shown in FIG. 2, essentially, in that, in the second embodiment of FIG. 3, reference capacitance 141 is not formed by a screening electrode of the measurement electrode of a capacitive proximity switch in conjunction with its environment, but reference capacitance 141 is made as a fixed internal capacitance in the form of a conventional capacitor.

In addition, the representation of the second embodiment of the second teaching of the invention in FIG. 3 clearly shows that the circuit is a bridge circuit.

In the description so far, reference has been made in part to the dimensioning of the circuit; more in this respect is given below.

The maximum frequency with which moving objects can still be acquired is normally below 100 Hz for capacitive proximity sensors, since the processes are relatively slow; although, in the extreme case, frequencies up to roughly 1 kHz can be required. The object acquisition frequency is limited by several factors. The most important are the clock frequency of clock generator 101, the size of storage capacitance 103, the time constants in filter network 118, the slew rate or bandwidth of output stage 105, and the time behavior of additional signal processing 127.

The variations of resistances in resistor networks 108, 121 are included in the measurement signal, but can be kept very small if the same resistor with the same value and the same design, tolerance, etc., is provided for both resistor networks 108, 121 as the largest possible portion on the resistance value, since the variations within a batch can be assumed to be very much less than would be theoretically possible. The total value of resistor networks 108, 121, itself, offers hardly any margin and arises essentially from the clock frequency of clock generator 101 and the connected capacitances of the unknown and parasitic capacitance. The relationship between these quantities can be described as follows in the first approximation:

$$R_{WN}=1/(f(C_m+C_p))$$

This applies to the case of optimum adjustment of the working point of a circuit in accordance with the invention.

The optimum operating voltage depends, essentially, on the operability of all connected active components. Favorable values are between 2.5 V and 6 V. At small operating voltages the signal-to-noise ratio is even less. In addition, at small operating voltages, electronic changeover contacts 102, 119, which are located in the optimum case as CMOS bilateral switches on a chip and which are made as changeover contacts with interruption (make-before-break), are slower in rise and delay times, so that the poorly defined changeover phases require proportionally more time. Furthermore, the attainable channel resistances are higher; this is likewise unfavorable for interference engineering. With regard to the operating voltage, at the same time, it must be watched that it should be relatively well stabilized under all operating conditions, in particular, the temperature behavior should be better than +/–2%, as much as possible, over the temperature range.

The power consumption of the circuit according to the invention is dependent essentially on the clock frequency and the size of the unknown capacitance. The lower the requirements for precision of the circuit according to the invention in the measurement of a capacitance, the more strongly the power consumption of this circuit can be reduced.

Finally, it should be pointed out again that output stage 105 can be made as a simple comparator, as described, for example, in the first embodiment, preferably for capacitive proximity switches and similar devices, such as, for example, fill level monitoring devices or hand probes with binary output function. However, output stage 105 can also be comprised of several comparators, for example, window comparators, in order to perform complex output functions, for example, an uncertain working range. Furthermore, output stage 105 can also be made as a charge amplifier, difference amplifier or AD converter or the like in order to perform especially analog sensor functions.

While various embodiments in accordance with the present invention have been shown and described, it is understood that the invention is not limited thereto, and is susceptible to numerous changes and modifications as known to those skilled in the art. Therefore, this invention is not limited to the details shown and described herein, and includes all such changes and modifications as are encompassed by the scope of the appended claims.

I claim:

1. Circuit for a capacitive circuit component comprising a clock generator, a first changeover contact having an input and first and second outputs, and being controlled by the clock generator, a sensor capacitor, a first storage capacitor having first and second electrodes, a first resistance network, a voltage source, and an evaluation stage; wherein an electrode of the sensor capacitor of the capacitive circuit component is connected to the input of the changeover contact, the first output of the first changeover contact is connected to the first electrode of the first storage capacitor, the first electrode of the first storage capacitor is connected via the first resistance network to the voltage source and is also connected to the evaluation stage, and the second electrode of the first storage capacitor is connected to a reference potential; wherein the evaluation stage is a current evaluator and essentially no voltage excursion occurs on the first changeover contact.

2. Circuit as claimed in claim 1, wherein said evaluation stage comprises a difference current amplifier, and wherein a microprocessor is series connected to the difference current amplifier.

3. Circuit as claimed in claim 1, further comprising an auxiliary voltage which is synchronized with a changeover frequency of the clock generator and which is applied to the capacitive circuit component.

4. Circuit as claimed in claim 3, wherein means for temporarily turning off the auxiliary voltage, thereby enabling the evaluation stage to generate a compensation measured value from a measured value which then remains.

5. Circuit as claimed in claim 3, wherein the auxiliary voltage is a modulated voltage.

6. Circuit as claimed in claim 3, wherein said auxiliary voltage is coupled via an external probe structure to the capacitive circuit component.

7. Circuit as claimed in claim 3, wherein said auxiliary voltage is coupled via an internal coupling capacitor to the capacitive circuit component.

8. Circuit as claimed in claim 1, further comprising a reference capacitor, a second changeover contact having an input and first and second outputs and being controlled by the clock generator, a second storage capacitor having first and second electrodes, and a second resistance network; wherein an electrode of the reference capacitor is connected to an input of the second changeover contact, a first output of the second changeover contact is connected to the first electrode of the second storage capacitor, the first electrode of the second storage capacitor is connected via the second resistance network to the voltage source and is also connected to the evaluation stage; and wherein the second electrode of the second storage capacitor is connected to a second reference potential.

9. Circuit as claimed in claim 8, wherein the second output of the first changeover contact is connected to the first output of the second changeover contact; and wherein the first output of the first changeover contact is connected to the second output of the second changeover contact.

10. Circuit as claimed in claim 8, wherein the second output of the first changeover contact and the second output of the second changeover contact are each connected to the reference potential.

* * * * *